United States Patent [19]
Lo et al.

[11] Patent Number: 6,030,893
[45] Date of Patent: Feb. 29, 2000

[54] CHEMICAL VAPOR DEPOSITION OF TUNGSTEN(W-CVD) PROCESS FOR GROWING LOW STRESS AND VOID FREE INTERCONNECT

[75] Inventors: Yung-Tsun Lo, Yi Lan; Cheng-Hsun Tsai, Taichung; Wen-Yu Ho, Tainan; Sung-Chung Hsieh, Taipei, all of Taiwan

[73] Assignee: Mosel Vitelic Inc., Taiwan

[21] Appl. No.: 08/760,665

[22] Filed: Dec. 9, 1996

[51] Int. Cl.$^7$ ...................................................... H01L 21/44
[52] U.S. Cl. ........................ 438/652; 438/674; 438/656; 438/672; 438/675
[58] Field of Search .................................... 438/652, 674, 438/656, 672, 675

[56] References Cited

U.S. PATENT DOCUMENTS 5,443,995  8/1995  Nulman .

OTHER PUBLICATIONS

Wolf, S. and Tauber, R.N., Silicon Processing for the VLSI Era, Lattice Press, pp. 399–404, 1986.

Primary Examiner—John F. Niebling
Assistant Examiner—J. I. Jones
Attorney, Agent, or Firm—Merchant & Gould, P.C.

[57] ABSTRACT

The present invention is a chemical vapor deposition of tungsten(W-CVD)process for growing low stress and void free interconnect. The method of this invention utilizes two steps W-CVD process by two chambers. The first step, filling tungsten metal completely in the contact hole, is performed in the first chamber. The second step, forming a tungsten layer for interconnect, is performed in the second chamber. Because of using two different chambers, the method of this invention can adjust the temperature of the process and the gas flow of the $WF_6$ vapor of the process for different required the two steps. The second step of chemical vapor deposition of tungsten by adjusting the temperature and the gas flow has reduced greatly the stress of the second conductive layer. Moreover, the first step of chemical vapor deposition of tungsten by adjusting the temperature and the gas flow prevents voids in the contact hole or in the via hole. Thus, growing low stress and voids free interconnect is accomplished by the method of this invention.

28 Claims, 3 Drawing Sheets

CHEMICAL VAPOR DEPOSITION OF TUNGSTEN(W-CVD) PROCESS FOR GROWING LOW STRESS AND VOID FREE INTERCONNECT

FIELD OF THE INVENTION

The present invention relates to chemical vapor deposition of tungsten(W-CVD) process and, more particularly, to a chemical vapor deposition of tungsten(W-CVD) process for growing low stress and void free interconnect.

BACKGROUND OF THE INVENTION

In semiconductor industry, interconnection process is performed by using a chemical vapor deposition of tungsten. Conventionally, the chemical vapor deposition of tungsten is performed in the single process chamber, because growing the tungsten film must fix the temperature of the process and can not have any temperature drift condition happened in order to keep the consistent quality of the film and the same thickness of the film. The traditional chemical vapor deposition of tungsten process for interconnection has two steps: the first step of chemical vapor deposition of tungsten is to fill a contact hole and a via hole. The second step of chemical vapor deposition of tungsten is to form an interconnect layer to fabricate interconnect lines. The first step of chemical vapor deposition of tungsten is required to form a void free and good step coverage tungsten film in order to fill in a contact hole and a via hole, but this tungsten film has high stress. The second step of chemical vapor deposition of tungsten is required to form a low stress tungsten film in order to fabricate interconnect lines.

FIG. 1 is a cross section view of a semiconductor wafer illustrating a conventional method for fabricating interconnect. A conductive area 12 is formed in a substrate 10. In this embodiment, forming the conductive area 12 is performed by any suitable process. The conductive area 12 can be a metal layer, a polysilicon layer or a source/drain/gate. A dielectric layer 14 is then deposited on the substrate 10 and the conductive area 12. Patterning the dielectric layer 24 and etching the dielectric layer 14 are to form a contact hole or a via hole exposing the conductive area. In this embodiment, patterning the dielectric layer 14 and etching the dielectric layer 14 are performed by any suitable suitable process. The dielectric layer 14 can be a BPSG layer, a TEOS layer, or an oxide layer. The thickness of the dielectric layer 14 is about 10000–50000 angstroms. A first tungsten film 16 is then formed on the dielectric layer 14 and filling in the contact hole. The first tungsten film 16 is performed by using the first step of chemical vapor deposition of tungsten. After that, a second tungsten film 18 is formed on the first tungsten film 16. The second tungsten film 18 is performed by using the second step of chemical vapor deposition of tungsten.

Unfortunately, a tungsten etching process is absent in this conventional process, so the second tungsten film 18 has high stress. The second tungsten film 18 with high stress causes the wafer bending. The bending wafer will effect the exposure of the subsequent photolithography process. If the bending phenomenon of the wafer is severe, then it may result in the stepper machine out of order. If the bending phenomenon of the wafer is light, then it also causes the defocus problem. Thus, the stress problem in conventional process has become the most big challenge.

SUMMARY OF THE INVENTION

In accordance with the present invention, a chemical vapor deposition of tungsten(W-CVD) process for growing low stress and voids free interconnect is disclose. In one embodiment, the method comprises forming a dielectric layer on a substrate with a conductive area. The dielectric layer covers the conductive area. The dielectric layer is then patterned and etched to form a hole exposing the conductive area.

A first conductive layer is then formed over the dielectric layer and completely fills in the hole. The formation of the first conductive layer is performed in a first chamber. The first conductive layer is for fabricating contact. A second conductive layer is then formed on the first conductive layer. The formation of the second conductive layer is performed in a second chamber. The temperature of the second chamber is different from the temperature of the first chamber. The second conductive layer is for fabricating interconnect lines. Consequently, unlike conventional process, the second conductive layer has low stress and low resistivity and the first conductive layer has no void and good step coverage.

BRIEF DESCRIPTION OF THE DRAWINGS

The forgoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
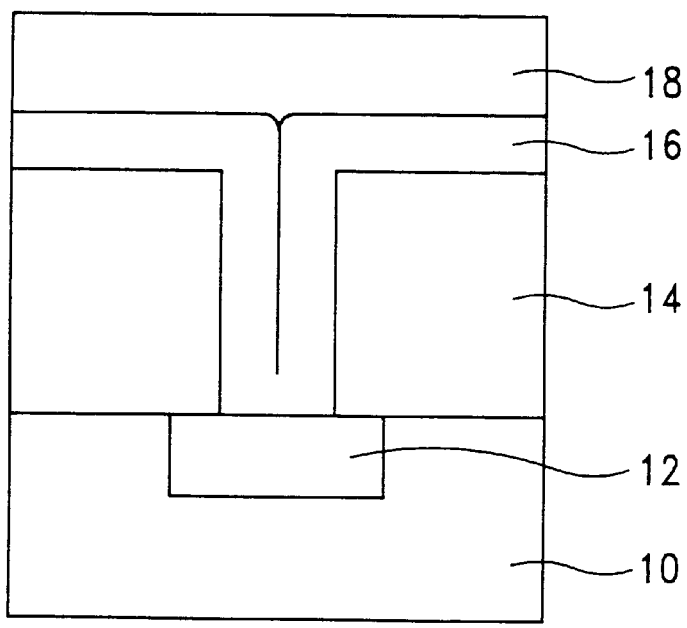
FIG. 1 is a cross section view of a semiconductor wafer illustrating a conventional method for fabricating interconnect.
Figure 2:
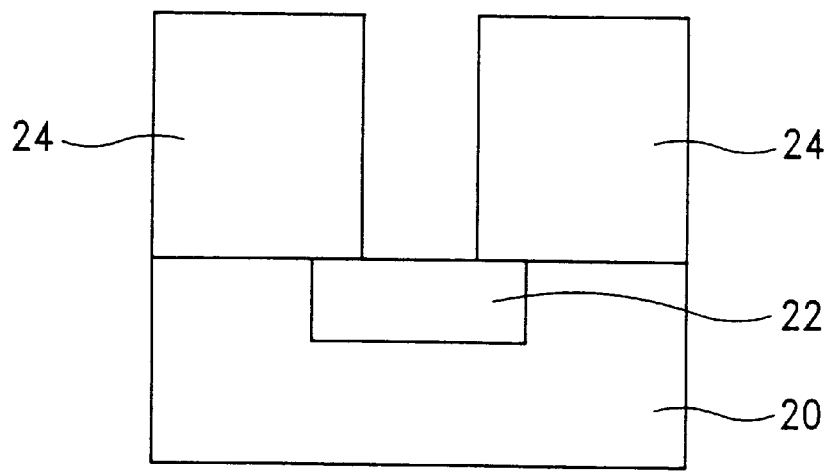
FIG. 2 is a cross section view of a semiconductor wafer illustrating the step of forming a hole according to one embodiment of the present invention.

FIG. 2 shows a cross section view of a semiconductor wafer with a contact hole. A conductive area 22 is formed in a substrate 20. In this embodiment, forming the conductive area 22 is performed by any suitable process. The conductive area 22 can be a metal layer, a polysilicon layer or a source/drain/gate. A dielectric layer 24 is then deposited on the substrate 20 and the conductive area 22. Patterning the dielectric layer 24 and etching the dielectric layer 24 are to form a contact hole or a via hole exposing the conductive area. In this embodiment, patterning the dielectric layer 24 and etching the dielectric layer 24 are performed by any suitable suitable process. The dielectric layer 24 can be a BPSG layer, a TEOS layer, or an oxide layer. The thickness of the dielectric layer 24 is about 10000–50000 angstroms.

Figure 3:
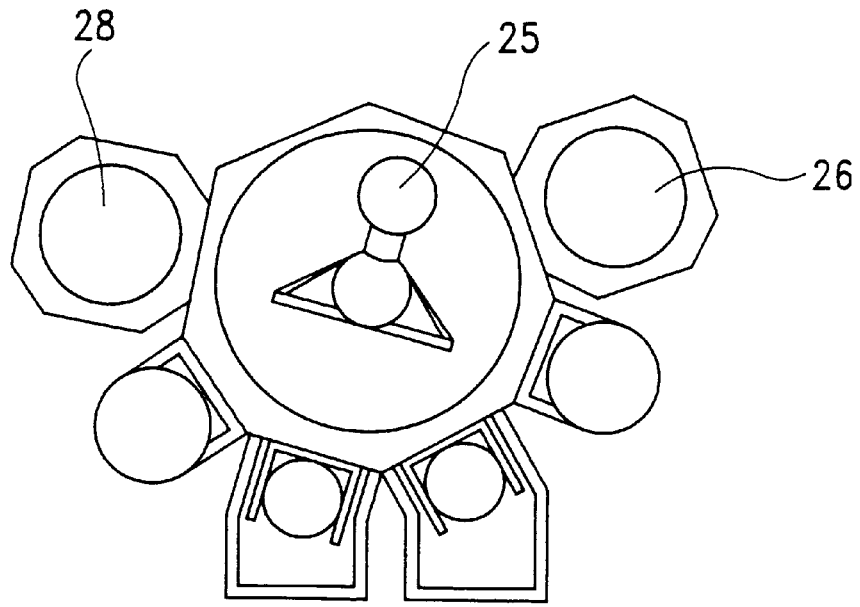
FIG. 3 is a cross section view of a machine for chemical vapor deposition according to one embodiment the present invention.
Figure 4:
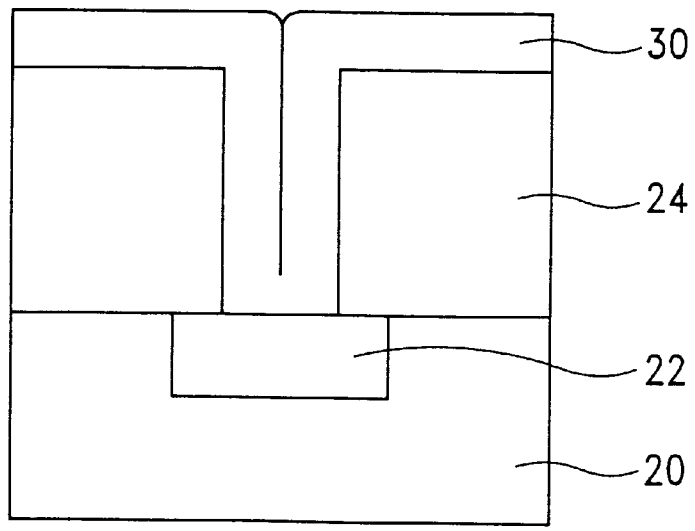
FIG. 4 is a cross section view of a semiconductor wafer illustrating the step of forming a first conductive layer according to one embodiment of the present invention.

After that, the wafer is send into a first chamber 26 by a robot 25 (shown in the FIG. 3) to form a first conductive layer 30 on the dielectric layer 24 and on the conductive area 22. FIG. 4 is a cross section view of a semiconductor wafer illustrating the step of forming a first conductive layer according to one embodiment of the present invention. The first conductive layer 30 is to fill the contact hole or the via hole. In this embodiment, the formation of the first conductive layer 30 is performed a first chemical vapor deposition of tungsten. The temperature of the process is controlled in a particular fixed temperature. The particular fixed temperature is in the range of 400° C. to 450° C. The chemical vapor deposition of tungsten is done by using a $WF_6$ vapor with a gas flow of about 50–90 sccm. Generally, the time of the process is controlled about 10–100 second. The thickness of the first conductive layer 30 has 500–9000 angstroms thick. Because the condition of the second chemical vapor deposition of tungsten is in lower temperature of the process and higher gas flow of $WF_6$ vapor of the process, the first conductive layer 30 formed in this process has the properties of high stress, good step coverage, and void-free. The resulting structure is shown in the FIG. 4.

Figure 5:
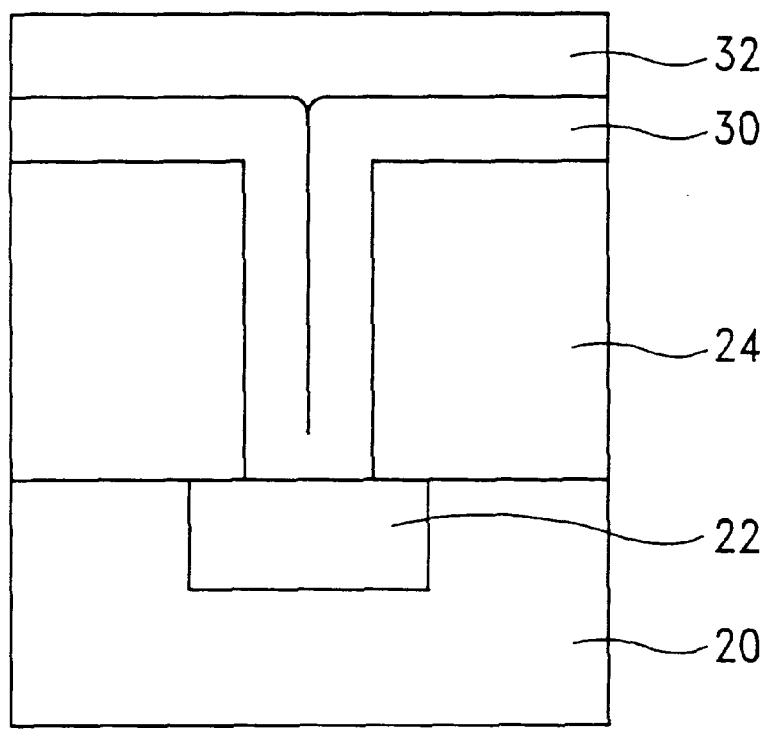
FIG. 5 is a cross section view of a semiconductor wafer illustrating the step of forming a second conductive layer according to one embodiment of the present invention.

Thereafter, the wafer is send into a first chamber 28 by a robot 25 (shown in the FIG. 3) to form a second conductive layer 32 on the first conductive layer 30. FIG. 5 is a cross section view of a semiconductor wafer illustrating the step of forming a first conductive layer according to one embodiment of the present invention. The second conductive layer 32 is to fabricate interconnect lines. In this embodiment, the formation of the second conductive layer 32 is performed a second chemical vapor deposition of tungsten. The temperature of the process is controlled in a particular fixed temperature. The particular fixed temperature is in the range of 450° C. to 490° C. The chemical vapor deposition of tungsten is done by using a $WF_6$ vapor with a gas flow of about 15–60 sccm. Generally, the time of the process is controlled about 10–100 second. The thickness of the second conductive layer 32 has 300–8000 angstroms thick. The second conductive layer 32 formed in this process has the property of low stress, because the condition of the second chemical vapor deposition of tungsten is in higher temperature of the process and lower gas flow of $WF_6$ vapor of the process. The resulting structure is shown in the FIG. 5.

Because of using two different chambers, the method of this invention can adjust the temperature of the process and the gas flow of the $WF_6$ vapor of the process. The second chemical vapor deposition of tungsten by adjusting the temperature and the gas flow has reduced greatly the stress of the second conductive layer 32. Moreover, the first chemical vapor deposition of tungsten by adjusting the temperature and the gas flow prevents voids in the contact hole or in the via hole. Thus, growing low stress and void free interconnect is accomplished by the method of this invention.

Although specific embodiment has been illustrated and described, it will be obvious to those skilled in the art that various modifications may be made without departing from the which is intended to be limited solely by the appended claims.

The embodiments of the invention in which an exclusive property or privilege is claimed are defined as follows:

1. A chemical vapor deposition of tungsten (W-CVD) process for growing low stress and void free interconnect, the method comprising:

forming a dielectric layer on a substrate, said substrate having a conductive area, said dielectric layer covering said conductive area;

forming a hole through said dielectric layer to uncover at least a portion of said conductive area;

forming a first conductive layer with a thickness of about 500 to 9000 Å on said dielectric layer and completely filling in said hole, wherein said first conductive layer is formed in a first chamber; and forming a second conductive layer on said first conductive layer, wherein said second conductive layer is formed in a second chamber, wherein the temperature of said second chamber is different from the temperature of said first chamber.

2. The process according to claim 1, wherein said hole comprises a contact hole.

3. The process according to claim 1, wherein said hole comprises a via hole.

4. The process according to claim 1, wherein said dielectric layer is about 10000–50000 angstroms thick.

5. The process according to claim 1, wherein said dielectric layer is selected from the group consisting of TEOS, BPSG and oxide layers.

6. The process according to claim 1, wherein said conductive area is selected from the group consisting of metal, polysilicon, and source/drain/gate area.

7. The process according to claim 1, wherein forming said first conductive layer comprises depositing by using a chemical vapor deposition process.

8. The process according to claim 7, wherein said chemical vapor deposition process comprises using a $WF_6$ vapor with a gas flow of about 50–90 sccm.

9. The process according to claim 7, wherein the temperature of said chemical vapor deposition process is controlled in the range of 400° C. to 450° C.

10. The process according to claim 7, wherein the time of said chemical vapor deposition process is about 10–100 seconds.

11. The process according to claim 1, wherein said first conductive layer comprises a tungsten metal layer.

12. The process according to claim 1, wherein said second conductive layer comprises a tungsten metal layer.

13. The process according to claim 1, wherein forming said second conductive layer comprises depositing by using a chemical vapor deposition process.

14. The process according to claim 13, wherein said chemical vapor deposition process comprises using a $WF_6$ vapor with a gas flow of about 15–60 sccm.

15. The process according to claim 13, wherein the temperature of said chemical vapor deposition process is controlled in the range of 450° C. to 490° C.

16. The process according to claim 13, wherein the time of said chemical vapor deposition process is about 10–100 seconds.

17. The process according to claim 1, wherein said second conductive layer is about 300–8000 angstroms thick.

18. The process according to claim 1, wherein the temperature of said first chamber is about 400° C.–450° C.

19. The process according to claim 1, wherein the temperature of said second chamber is about 450° C.–490° C.

20. A chemical vapor deposition of tungsten (W-CVD) process for growing low stress and void free interconnect, the method comprising:

forming a dielectric layer with a thickness of about 10000 to 50000Å on a substrate, said substrate having a conductive area, said dielectric layer covering said conductive area;

forming a hole through said dielectric layer to uncover at least a portion of said conductive area;

forming a first conductive layer with a thickness of about 500 to 9000Å on said dielectric layer and completely filling in said hole, wherein said first conductive layer is formed by using a first chemical vapor deposition process in a first chamber, wherein the temperature of said first chamber is about 400° C.–450° C.;

forming a second conductive layer with a thickness of about 300 to 8000Å on said first conductive layer, wherein said second conductive layer is formed by using a second chemical vapor deposition process in a second chamber, wherein the temperature of said second chamber is about 450° C.–490° C.

21. The process according to claim 20, wherein said first chemical vapor deposition process comprises using a WF$_6$ vapor with a gas flow of about 50–90 sccm.

22. The process according to claim 20, wherein the temperature of said first chemical vapor deposition process is controlled in the range of 400° C. to 450° C.

23. The process according to claim 20, wherein the time of said first chemical vapor deposition process is about 10–100 seconds.

24. The process according to claim 20, wherein said second chemical vapor deposition process comprises using a WF$_6$ vapor with a gas flow of about 15–60 sccm.

25. The process according to claim 20, wherein the temperature of said second chemical vapor deposition process is controlled in the range of 450° C. to 490° C.

26. The process according to claim 20, wherein the time of said second chemical vapor deposition process is about 10–100 seconds.

27. A chemical vapor deposition of tungsten (W-CVD) process for growing low stress and void free interconnect, the method comprising:

forming a dielectric layer with a thickness of about 10000 to 50000Å on a substrate, said substrate having a conductive area, said dielectric layer covering said conductive area;

forming a hole through said dielectric layer to uncover at least a portion of said conductive area;

forming a first conductive layer on said dielectric layer and completely filling in said hole, wherein said first conductive layer is formed in a first chamber; and forming a second conductive layer on said first conductive layer, wherein said second conductive layer is formed in a second chamber, wherein the temperature of said second chamber is different from the temperature of said first chamber.

28. A chemical vapor deposition of tungsten (W-CVD) process for growing low stress and void free interconnect, the method comprising:

forming a dielectric layer on a substrate, said substrate having a conductive area, said dielectric layer covering said conductive area;

forming a hole through said dielectric layer to uncover at least a portion of said conductive area;

forming a first conductive layer on said dielectric layer and completely filling in said hole, wherein said first conductive layer is formed in a first chamber; and forming a second conductive layer with a thickness of about 300 to 8000Å on said first conductive layer, wherein said second conductive layer is formed in a second chamber, wherein the temperature of said second chamber is different from the temperature of said first chamber.

* * * * *